US011120979B1

United States Patent
Asakawa

(10) Patent No.: US 11,120,979 B1
(45) Date of Patent: Sep. 14, 2021

(54) TIME-OF-FLIGHT MASS SPECTROMETER AND TIME-OF-FLIGHT MASS SPECTROMETRY METHOD

(71) Applicant: Kioxia Corporation, Tokyo (JP)

(72) Inventor: Jun Asakawa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/998,405

(22) Filed: Aug. 20, 2020

(30) Foreign Application Priority Data

Mar. 13, 2020 (JP) .............................. JP2020-043737

(51) Int. Cl.
- H01J 49/02 (2006.01)
- H01J 49/00 (2006.01)
- H01J 49/40 (2006.01)
- H01J 43/24 (2006.01)
- H01J 37/244 (2006.01)
- H01J 49/44 (2006.01)

(52) U.S. Cl.
CPC .......... H01J 49/022 (2013.01); H01J 37/244 (2013.01); H01J 43/246 (2013.01); H01J 49/0027 (2013.01); H01J 49/025 (2013.01); H01J 49/40 (2013.01); H01J 49/446 (2013.01)

(58) Field of Classification Search
CPC .... H01J 49/022; H01J 49/0027; H01J 49/025; H01J 49/40; H01J 49/446; H01J 43/246; H01J 37/244

USPC ................................ 250/287, 286, 283, 397
See application file for complete search history.

(56) References Cited

U.S. PATENT DOCUMENTS

| 2011/0095178 A1* | 4/2011 | Giannakopulos | H01J 37/244 250/282 |
| 2014/0151549 A1* | 6/2014 | Steiner | H01J 49/025 250/288 |
| 2015/0162174 A1* | 6/2015 | Badiei | H01J 49/0009 250/288 |
| 2016/0133448 A1* | 5/2016 | Silivra | H01J 49/0009 250/252.1 |

FOREIGN PATENT DOCUMENTS

JP      H11-288684 A      10/1999

\* cited by examiner

*Primary Examiner* — Kiet T Nguyen
(74) *Attorney, Agent, or Firm* — Foley & Lardner LLP

(57) ABSTRACT

A time-of-flight mass spectrometer includes a beam irradiation unit that generates an ionized particle by emitting an ion beam in a pulse form to a sample, a mass spectrometry unit that causes the ionized particle to fly, an MCP disposed in the mass spectrometry unit to measure a mass by amplifying the ionized particle, an MCP power source that applies a voltage to the MCP, and an MCP gain adjustment unit that adjusts a gain of the voltage. The MCP gain adjustment unit adjusts the gain of the voltage until a subsequent pulse is emitted after the beam irradiation unit emits a first pulse of the ion beam.

18 Claims, 8 Drawing Sheets

FIG. 1
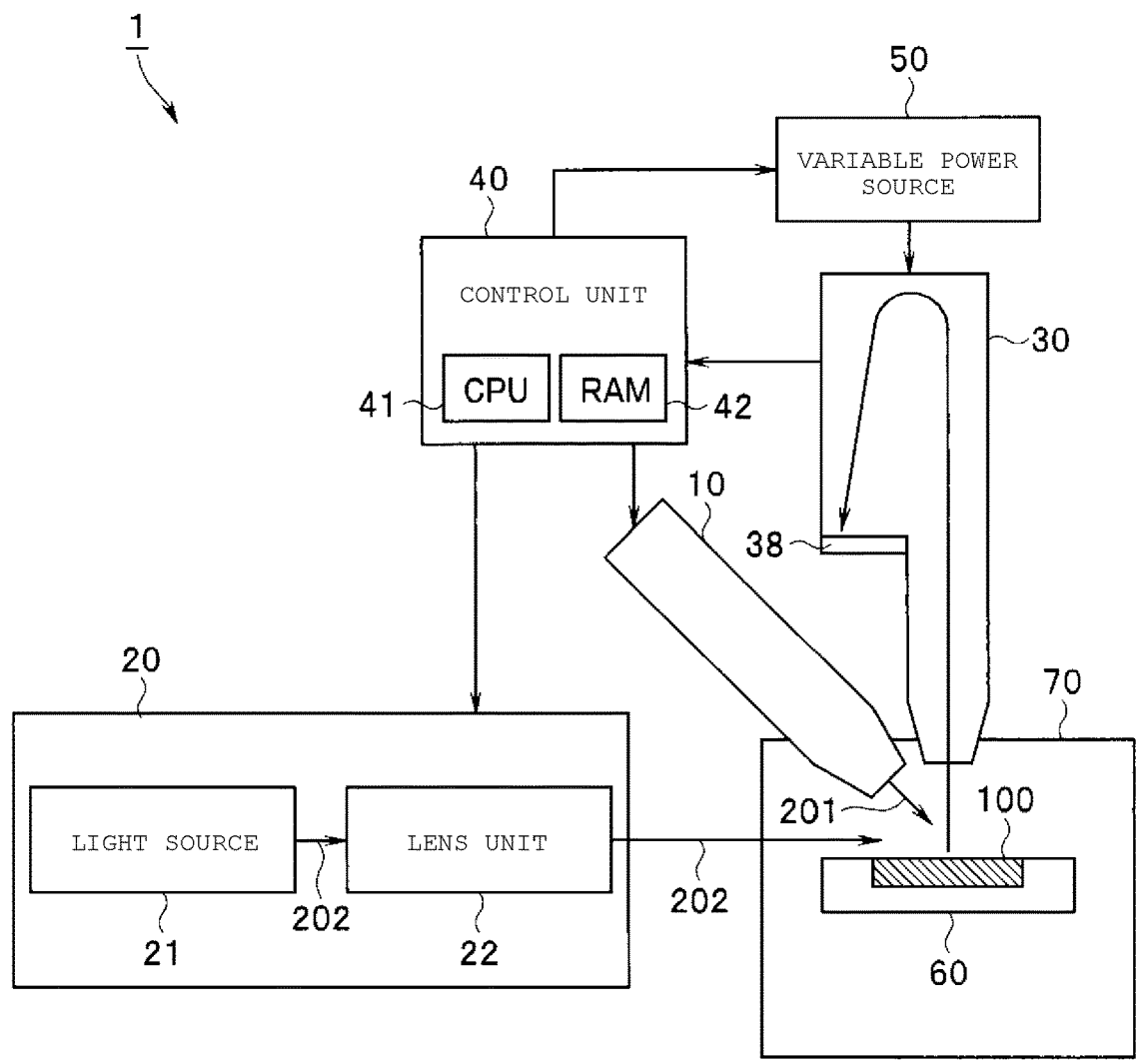
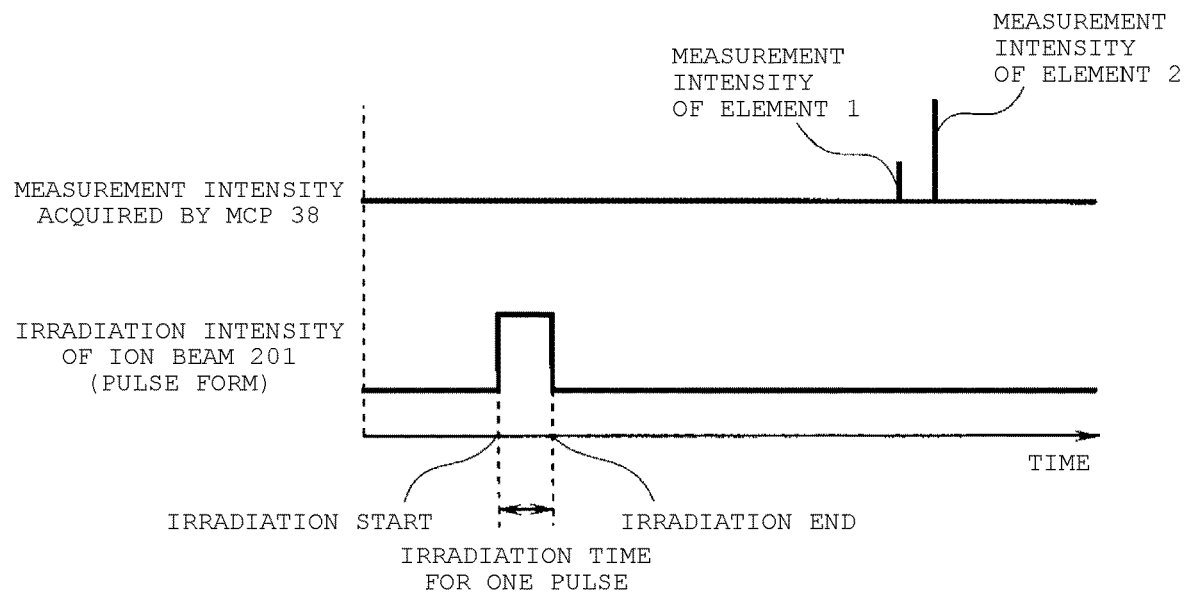

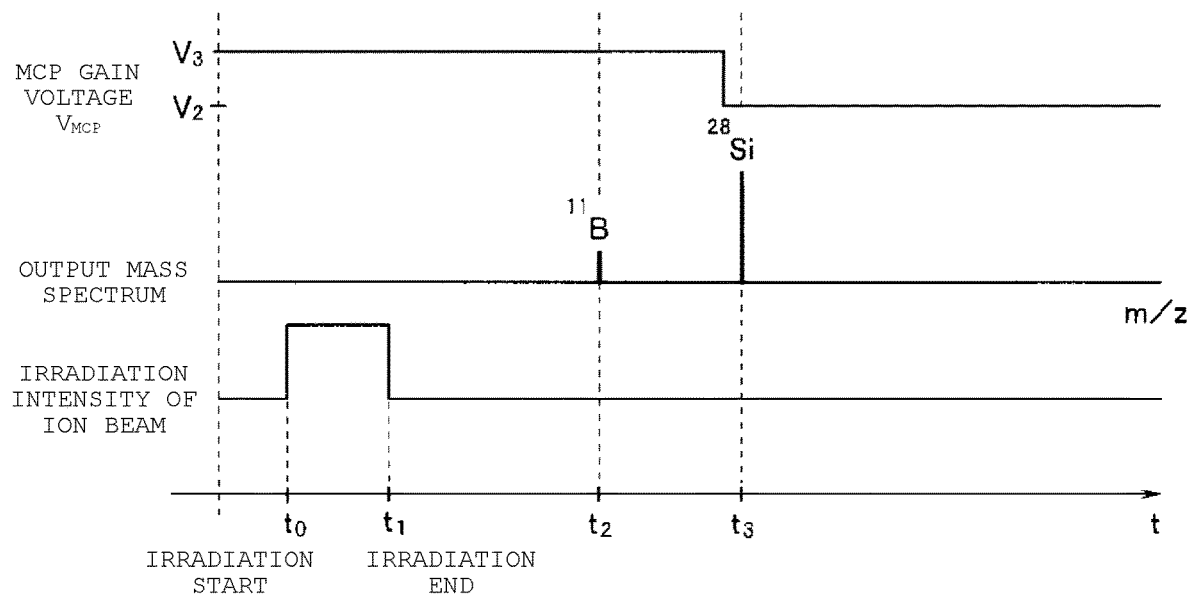
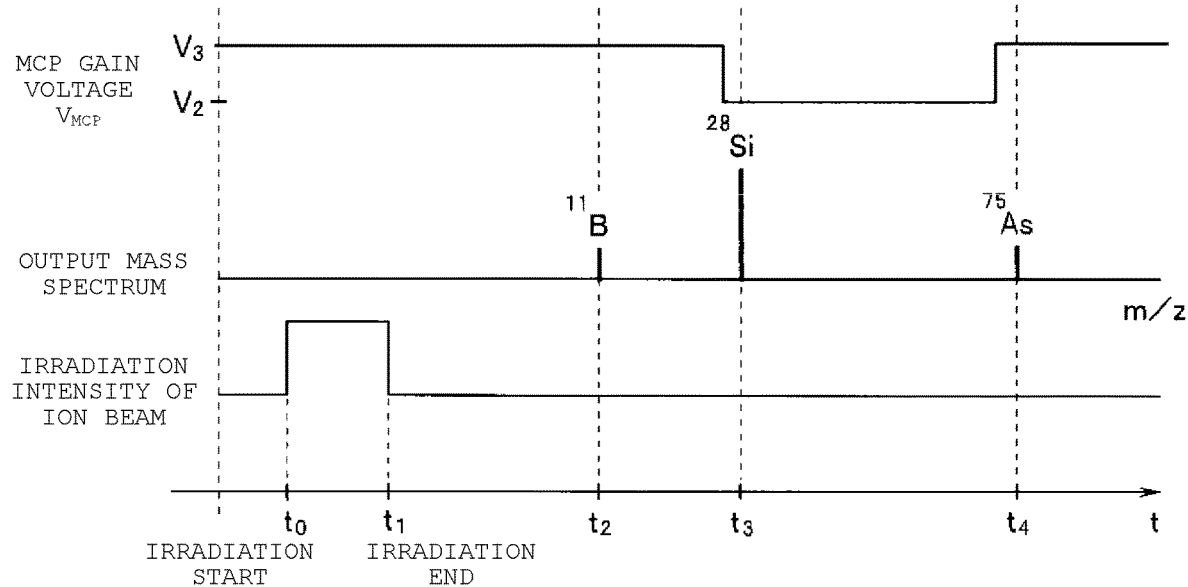

TIME-OF-FLIGHT MASS SPECTROMETER AND TIME-OF-FLIGHT MASS SPECTROMETRY METHOD

CROSS-REFERENCE TO RELATED APPLICATION

This application is based upon and claims the benefit of priority from Japanese Patent Application No. 2020-043737, filed Mar. 13, 2020, the entire contents of which are incorporated herein by reference.

FIELD

Embodiments described herein relate generally to a time-of-flight mass spectrometer and a time-of-flight mass spectrometry method.

BACKGROUND

A time-of-flight mass spectrometer is known as a device that analyzes amass of an element existing in a semiconductor substrate or a film formed on the semiconductor substrate.

Examples of related art include JP-A-11-288684.

DESCRIPTION OF THE DRAWINGS

FIG. 1 is a block diagram illustrating a configuration example of a time-of-flight mass spectrometer according to at least one embodiment of the present disclosure.

FIG. 8 is a view illustrating an example of a relationship between a mass spectrum and an MCP gain voltage according to a first embodiment.

FIG. 9 is a view illustrating another example of the relationship between the mass spectrum and the MCP gain voltage according to the first embodiment.

DETAILED DESCRIPTION

Figure 2:
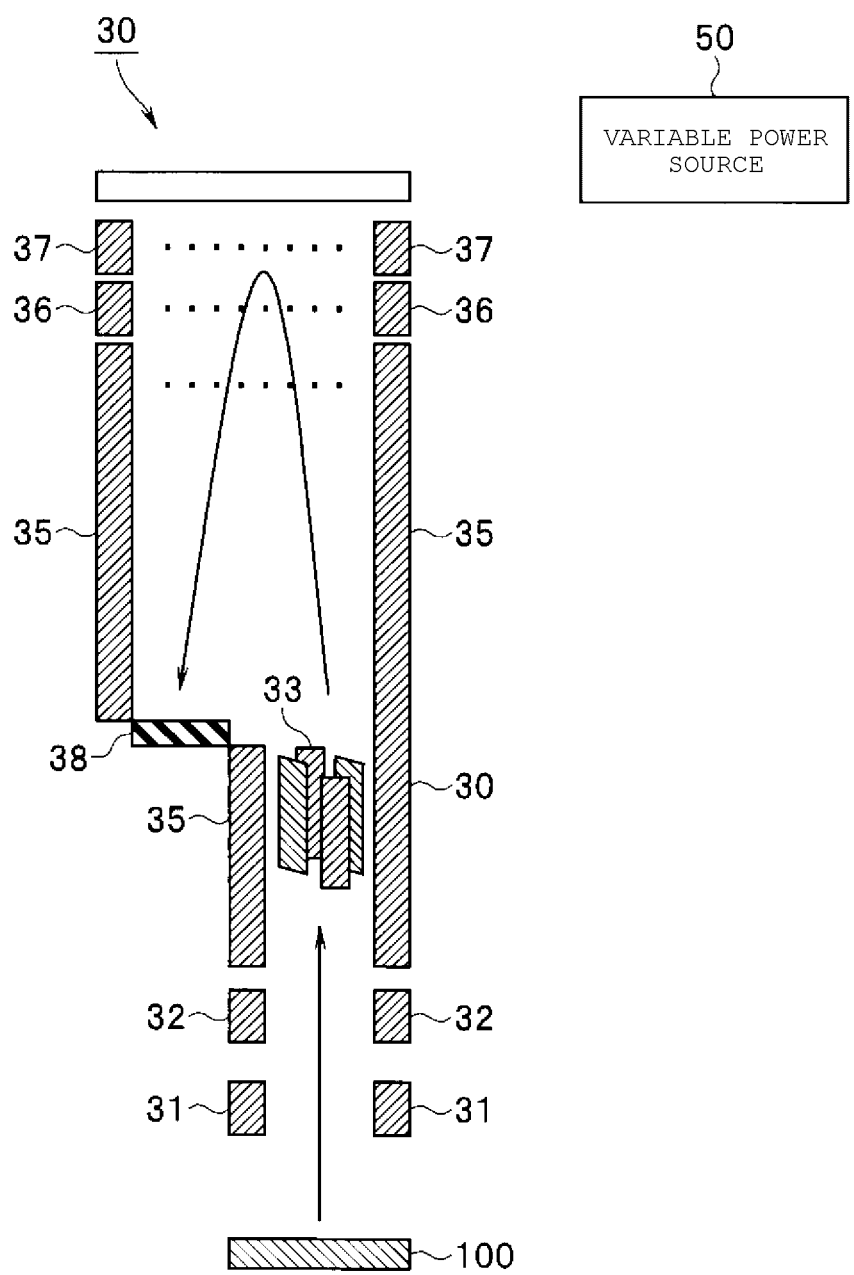
FIG. 2 is a block diagram schematically illustrating an example of an internal configuration of a mass spectrometry unit.

At least one embodiment provides a time-of-flight mass spectrometer and a time-of-flight mass spectrometry method, which can prevent degradation of a measurer and can accurately measure both a low concentration element and a high concentration element.

In general, according to at least one embodiment, there is provided a time-of-flight mass spectrometer including an ion light source that generates an ionized particle by emitting an ion beam in a pulse form to a sample, a mass spectrometry chamber that causes the ionized particle to fly, an MCP ion measurer disposed in the mass spectrometry chamber to measure amass by amplifying the flown ionized particle, an MCP voltage application unit (source) that applies a voltage to the MCP ion measurer, and an MCP gain adjustment unit (adjuster) that adjusts a gain of the voltage. The MCP gain adjustment unit adjusts the gain of the voltage until a subsequent pulse is emitted after the ion light source emits a first pulse of the ion beam.

Hereinafter, embodiments will be described with reference to the drawings.

First Embodiment

FIG. 1 is a block diagram illustrating a configuration example of a time-of-flight mass spectrometer according to at least one embodiment of the present disclosure. A time-of-flight mass spectrometer 1 according to at least one embodiment includes a beam irradiation unit 10, a laser irradiation unit 20, a mass spectrometry unit 30, a control unit 40, a variable power source 50, a sample stage 60, and a chamber 70.

The beam irradiation unit 10 serving as an ion light source irradiates a sample 100 placed on the sample stage 60 with an ion beam 201 in a pulse form. For example, the ion beam 201 is a focused ion beam (FIB) containing a gallium ion. When the sample 100 is irradiated with the ion beam 201 inside the chamber 70 in a vacuum state, the sample 100 is sputtered, and a particle is emitted from a surface of the sample 100.

The laser irradiation unit 20 may have a light source 21 and a lens unit 22. The light source 21 emits a laser beam 202. The laser beam 202 is focused by the lens unit 22, and an upper portion of the sample 100 is irradiated with the laser beam 202. The particle emitted from the sample 100 is ionized by the laser beam 202. The ionized particle ionized by the laser beam 202 is subjected to mass spectrometry by the mass spectrometry unit 30. The mass spectrometry unit 30 has a micro channel plate (MCP) 38 as will be described later.

FIG. 2 is a block diagram schematically illustrating an example of an internal configuration of the mass spectrometry unit. The mass spectrometry unit 30 illustrated in FIG. 2 is a reflectron type in which the ionized particle drawn into the mass spectrometry unit 30 is caused to fly so that a flight direction is reversed halfway. Specifically, the mass spectrometry unit 30 serving as a mass spectrometry chamber has a drawing electrode 31, a lens electrode 32, a first deflection electrode 33, a second deflection electrode 34, a drift electrode 35, and an R-top electrode 36, an R-bot electrode 37, and the micro channel plate (MCP) 38.

Each of the drawing electrode 31 to the R-bot electrode 37 is disposed along a trajectory of the ionized particle. In addition, the electrodes are connected to the variable power source 50. The variable power source 50 can adjust a voltage applied to each electrode, based on control of the control unit 40.

When the voltage is applied, the drawing electrode 31 forms an electric field between the sample 100 and the mass spectrometry unit 30. The electric field draws the ionized particle into the mass spectrometry unit 30. The voltage is applied to the lens electrode 32. Accordingly, the lens electrode 32 can converge a flight path of the ionized particle drawn by the drawing electrode 31.

Further, the respective voltages applied to the first deflection electrode 33, the second deflection electrode 34, and the drift electrode 35 can be adjusted by the variable power source 50. Since the voltages applied to the first deflection electrode 33, the second deflection electrode 34, and the drift electrode 35 are adjusted, a trajectory of the ionized particle passing through the drawing electrode 31 and the lens electrode 32 can be adjusted to reach the MCP 38. Furthermore, since the voltages applied to the R-top electrode 36 and the R-bot electrode 37 are adjusted by the variable power source 50, a reversal characteristic of a flight direction of the ionized particle can be adjusted.

Figure 3:
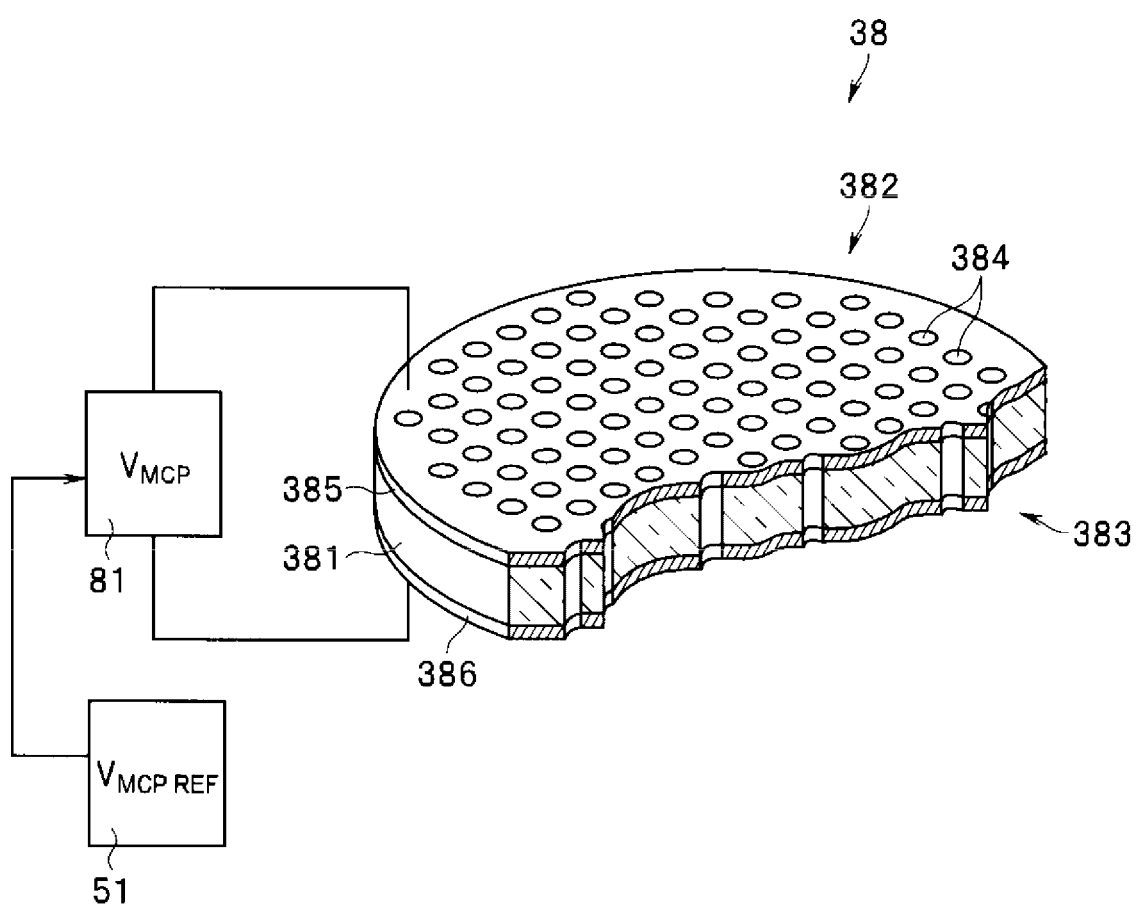
FIG. 3 is a perspective view of a cross section of an MCP.

FIG. 3 is a perspective view of a cross section of the MCP. The MCP 38 serving as an ion measurer includes a substrate 381 having a plurality of micro channels (through-holes) 384. The MCP 38 functions as the ion measurer, and each of the plurality of micro channels 384 functions as a channel for electron multiplication. The micro channel 384 extends from a top surface 382 of the substrate 381 to a bottom surface 383 of the substrate 381. The top surface 382 of the substrate 381 is coated with an electrode material, and has an input side electrode 385 formed thereon. The bottom surface 383 of the substrate 381 may also be coated with an electrode material, and has an output side electrode 386 formed thereon. The MCP gain adjustment unit 81 (gain adjuster) applies an MCP gain voltage $V_{MCP}$ between the input side electrode 385 and the output side electrode 386. The MCP gain adjustment unit 81 generates the MCP gain voltage $V_{MCP}$, based on an MCP reference voltage $V_{MCP\_REF}$ supplied from a MCP reference voltage application unit 51 (reference voltage source). The voltage may be supplied from the variable power source 50 to the MCP 38. That is, the MCP gain adjustment unit 81 and the MCP reference voltage application unit 51 may be provided as a part of the variable power source 50 according to at least one embodiment.

Figure 4:
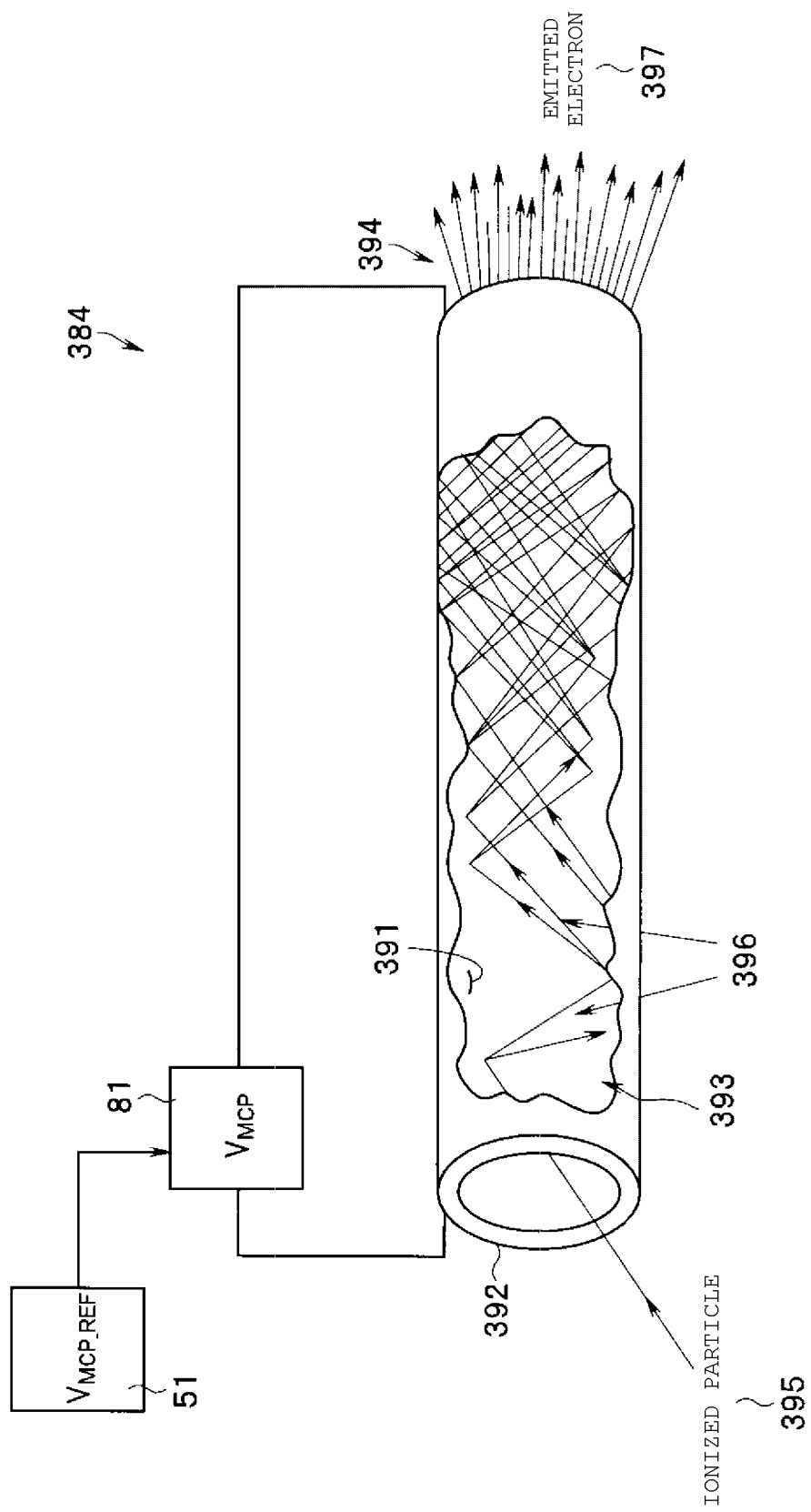
FIG. 4 is a perspective view of a micro channel of the MCP.

FIG. 4 is a perspective view of the micro channel of the MCP. The micro channel (through-hole) 384 has a channel wall (inner wall) 391 and a channel space 393, and functions as a channel for electron multiplication. The MCP gain voltage $V_{MCP}$ is applied between an input side opening 392 and an output side opening 394 of the micro channel (through-hole) 384 by the MCP reference voltage application unit 51 and the MCP gain adjustment unit 81. When the ionized particle 395 is incident on the channel space 393 from the input side opening 392 in a state where the MCP gain voltage $V_{MCP}$ is applied, the ionized particle 395 collides with the channel wall (inner wall) 391, and two or more secondary electrons 396 are emitted. The emitted secondary electrons 396 also collide with the channel wall (inner wall) 391 due to a potential gradient, and the secondary electrons 396 are further repeatedly emitted (cascade multiplication of the secondary electron). Many secondary electrons subjected to cascade multiplication in this way are emitted as emitted electrons 397 from the output side opening 394.

Figure 5:
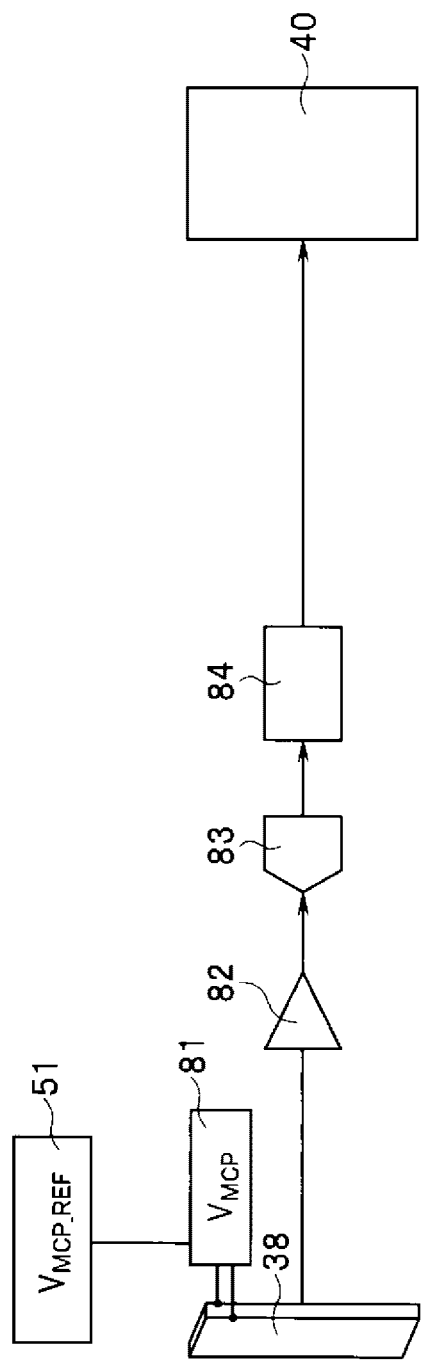
FIG. 5 is a block diagram illustrating a configuration example of an ion measurement mechanism.

The emitted electrons multiplied by the MCP 38 configured as described above are counted by an ion measurement mechanism. FIG. 5 is a block diagram illustrating a configuration example of the ion measurement mechanism. The MCP gain voltage $V_{MCP}$ is applied to the MCP 38 from the MCP gain adjustment unit 81. The ionized particle incident on the MCP 38 is amplified by the MCP 38, and is emitted as the emitted electron. The emitted electron emitted from the MCP 38, that is, a measurement signal (analog signal) is amplified by a preamplifier 82, and thereafter, is converted into a digital signal by an AD converter 83. The digitized measurement signal is output to the control unit 40 after an S/N ratio is improved by a signal averager 84.

The control unit 40 includes a central processing unit (CPU) 41 as a processor, and a RAM 42. The CPU 41 is operated in accordance with a program stored in a memory (not illustrated). The CPU 41 has a control function for controlling operations and settings of each unit (beam irradiation unit 10, laser irradiation unit 20, or variable power source 50) that configures the time-of-flight mass spectrometer 1, and also has a data analysis function for analyzing a measurement signal output from the mass spectrometry unit 30. That is, the measurement signal input from the mass spectrometry unit 30 is analyzed, an element contained in the sample 100 is identified, and a mass is calculated for each element. The RAM 42 stores the analyzed data and various set values.

For example, when analyzing the mass of the element existing in the semiconductor substrate, such as measuring concentration of a P well formed in the semiconductor substrate, the mass of the element (for example, $^{11}$B (boron)) implanted in the substrate is much smaller than the mass of the element (for example, $^{28}$Si (silicon)) that constitutes the semiconductor substrate and is contained in the sample 100. For example, when the concentration of $^{11}$B of the P well is approximately 1e+15 cm$^{-3}$ whereas the concentration of $^{28}$Si which is the substrate is approximately 5e+22 cm$^{-3}$, the concentration of $^{11}$B is 10$^{-7}$ times lower than the concentration of $^{28}$Si. When analyzing the sample 100, most of the ionized particles drawn into the mass spectrometry unit 30 are the ionized $^{28}$Si, and the amount of the ionized $^{11}$B is extremely small.

A secondary electron amplification factor of the MCP 38 increases as the MCP gain voltage $V_{MCP}$ applied to the MCP 38 increases. Therefore, it is desired to increase the MCP gain voltage $V_{MCP}$ in order to analyze the element existing at a low concentration. However, when the MCP gain voltage $V_{MCP}$ is increased to increase the secondary electron amplification factor, the measurer is brought into a state of being saturated with the element existing at high concentration (a state where the channel wall 391 is saturated with the generated secondary electron, and the secondary electron amplification factor does not increase even if the MCP gain voltage $V_{MCP}$ is increased). That is, the measurer is brought into a state where measurement efficiency is not raised even if the MCP gain voltage $V_{MCP}$ is increased.

In addition, in the MCP 38, when a total output charge amount exceeds a certain threshold (for example, 1e-2C·cm$^{-2}$), the secondary electron amplification factor is lowered, and durability is degraded. Therefore, when the measurer performs the analysis in the saturated state, the durability of the MCP 38 is degraded earlier than a case where the measurer performs the analysis in a non-saturated state. Accordingly, a lifetime of the MCP 38 may be shortened.

Therefore, the time-of-flight mass spectrometer 1 according to at least one embodiment lowers the MCP gain voltage $V_{MCP}$ when measuring the element existing at the high concentration in the sample 100, and raises the MCP gain voltage $V_{MCP}$ when measuring the element existing at the low concentration (i.e., at a first concentration). In this manner, the degradation of the MCP 38 is prevented, and both the low concentration element and the high concentration element are accurately measured.

Figure 6:
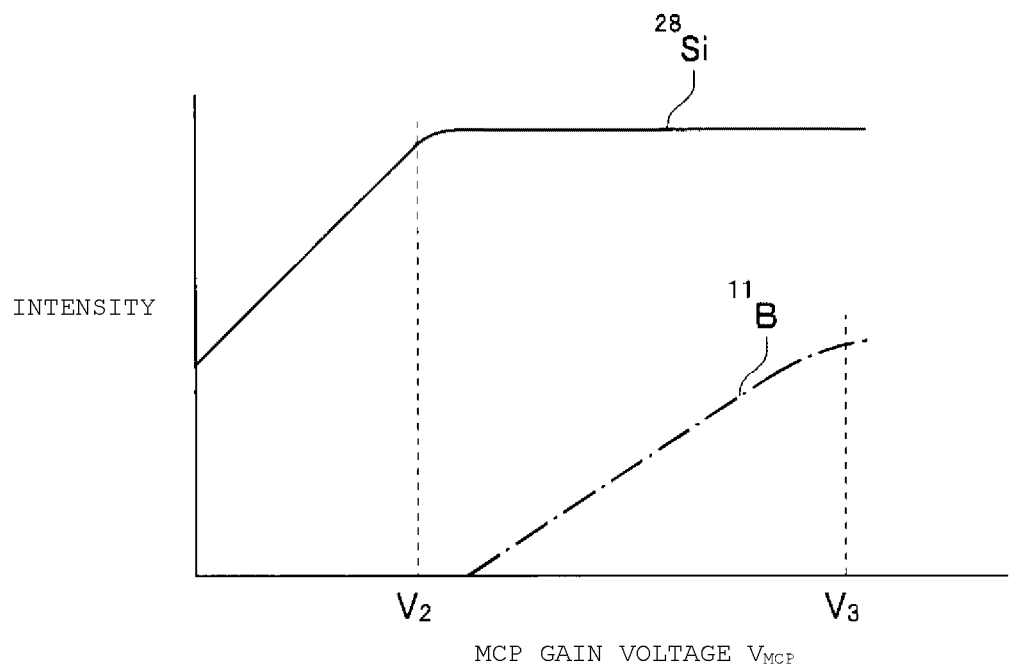
FIG. 6 is a view illustrating a relationship between an MCP gain voltage and measurement intensity.

Hereinafter, a method of controlling the MCP gain voltage $V_{MCP}$ will be described. In the following description, a Si (silicon) semiconductor substrate having the P well formed by B (boron) implantation is used as the sample 100. The low concentration element (a first concentration element) serving as a measurement target is set to $^{11}$B, and the high concentration element (a second concentration element) is set to $^{28}$Si. First, prior to the analysis, the MCP gain voltage $V_{MCP}$ used when measuring $^{11}$B and the MCP gain voltage $V_{MCP}$ used when measuring $^{28}$Si are determined. FIG. 6 is a view illustrating a relationship between the MCP gain voltage and the measurement intensity. In FIG. 6, a horizontal axis represents the MCP gain voltage $V_{MCP}$, and a vertical axis represents the measurement intensity of the ionized particle. In addition, in FIG. 6, the measurement intensity of $^{28}$Si is illustrated by a solid line, and the measurement intensity of $^{11}$B is illustrated by a dashed line.

In a case of $^{28}$Si, which is the high concentration element contained in a large amount in the sample 100, the measurement intensity increases as the MCP gain voltage $V_{MCP}$ increases in a range where the MCP gain voltage $V_{MCP}$ increases up to $V_2$. When the MCP gain voltage $V_{MCP}$ exceeds $V_2$, even if the MCP gain voltage $V_{MCP}$ increases, the measurement intensity has a substantially constant value, and is not changed. That is, in measuring $^{28}$Si, the measurer is in a non-saturated state in a range where the MCP gain voltage $V_{MCP}$ is equal to or lower than $V_2$, and the measurer is in a saturated state when the MCP gain voltage $V_{MCP}$ exceeds $V_2$.

On the other hand, in a case of $^{11}$B which is the low concentration element contained in a small amount in the sample 100, the measurement intensity increases as the MCP gain voltage $V_{MCP}$ increases until the MCP gain voltage $V_{MCP}$ reaches $V_3$ which is a measurement limit (measurable upper limit voltage specified by device specifications). That is, in measuring $^{11}$B, the measurer is in the non-saturated state until the MCP gain voltage $V_{MCP}$ increases up to $V_3$.

As described above, the MCP gain voltage $V_{MCP}$ when measuring $^{28}$Si is set to $V_2$, and the MCP gain voltage $V_{MCP}$ when measuring $^{11}$B is set to $V_3$. In this manner, measurement sensitivity of the low concentration element can be improved while the saturation caused by the high concentration element can be prevented. Therefore, both the low concentration element and the high concentration element can be accurately measured. In addition, the measurement is not performed in a saturation region. Accordingly, the degradation of the MCP 38 can be prevented. In a whole measurable voltage range specified by the device specifications, when the measurement intensity remains substantially constant without any change even if the MCP gain voltage $V_{MCP}$ increases, a lower limit voltage of the measurable voltage is set to the MCP gain voltage $V_{MCP}$.

Figure 7:
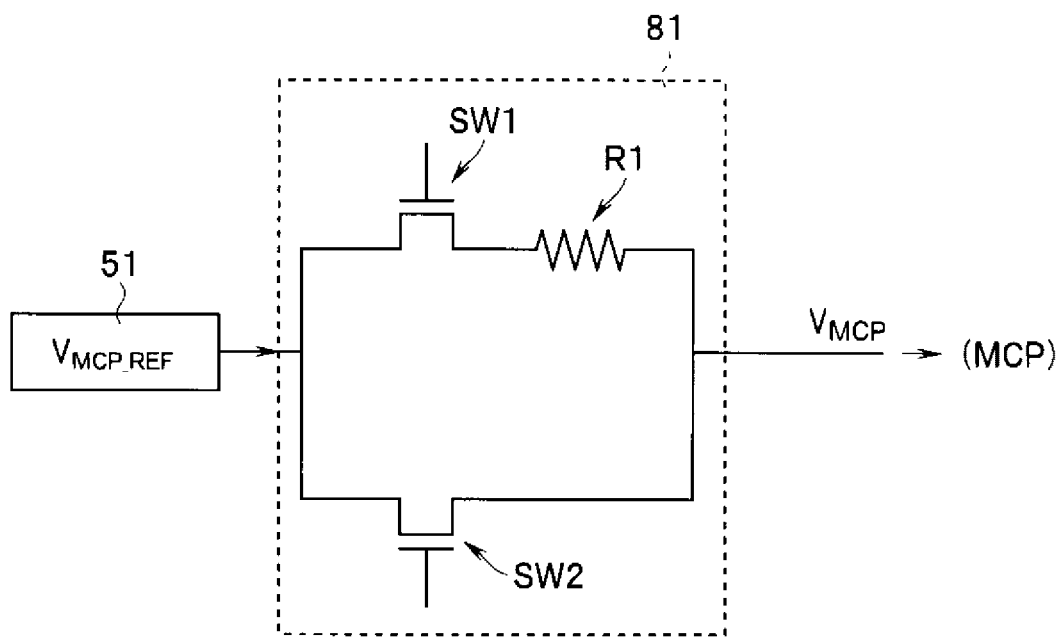
FIG. 7 is a circuit diagram illustrating a configuration example of an MCP gain adjustment unit.

FIG. 7 is a circuit diagram illustrating a configuration example of the MCP gain adjustment unit 81. The MCP gain adjustment unit 81 illustrated in FIG. 7 has a plurality of wires disposed in parallel between an input terminal to which the MCP reference voltage $V_{MCP\_REF}$ is input from the MCP reference voltage application unit 51 and an output terminal from which the MCP gain voltage $V_{MCP}$ is output to the MCP 38. (FIG. 7 illustrates an example in which two wires are disposed in parallel). Each wire has one switch SW. In FIG. 7, a switch SW1 is disposed in an upper wire, and a switch SW2 is disposed in a lower wire.

In addition, in each wire, a resistor R serving as a voltage conversion unit that converts an input voltage into a desired MCP gain voltage is inserted between the switch SW and the output terminal. In order that the MCP reference voltage $V_{MCP\_REF}$ input from the input terminal is output as the MCP gain voltage $V_{MCP}$ without any change, it is preferable to provide one circuit into which no resistor is inserted. In FIG. 7, the resistor R1 is disposed in a rear stage of the switch SW1 in the upper wire. However, the resistor is not inserted into the lower wire. That is, when it is assumed that a voltage drop caused by the wire can be ignored, the voltage output from each wire is a value obtained by subtracting a voltage drop portion caused by the resistor R from the input MCP reference voltage $V_{MCP\_REF}$.

In the circuit illustrated in FIG. 7, a value of the input MCP reference voltage $V_{MCP\_REF}$ is $V_3$. The MCP gain voltage $V_{MCP}$ output from the upper wire is $V_2$ obtained by subtracting the voltage drop portion in the resistor R1, and the MCP gain voltage $V_{MCP}$ output from the lower wire is $V_3$. That is, when the MCP gain voltage $V_{MCP}$ needs to be set to $V_2$, the switch SW1 is turned on, and the switch SW2 is turned off. In this manner, only the upper wire is used as an active path. In addition, when the MCP gain voltage $V_{MCP}$ needs to be set to $V_3$, the switch SW1 is turned off, and the switch SW2 is turned on. In this manner, only the lower wire is used as the active path.

The circuit illustrated in FIG. 7 is an example of the MCP gain adjustment unit 81, and other circuit configurations such as adjusting the output voltage value by using a variable resistor may be adopted according to at least one embodiment.

Next, a measurement method of using the time-of-flight mass spectrometer 1 according to at least one embodiment of the present disclosure will be described with reference to FIG. 8. FIG. 8 is a view illustrating an example of the relationship between the mass spectrum and the MCP gain voltage according to at least one embodiment. In FIG. 8, the horizontal axis represents time. The chart in the lower stage of FIG. 8 illustrates irradiation intensity of the ion beam 201. That is, the irradiation of the sample 100 with the ion beam 201 starts at time $t_0$, and the irradiation of the ion beam 201 ends at time $t_1$. In FIG. 8, the chart in the middle stage illustrates the measurement intensity (output mass spectrum) in the MCP 38, in the ionized particle emitted by the irradiation of the ion beam 201 and ionized by the laser beam. That is, the ionized particle obtained by the irradiation of the ion beam 201 from time $t_0$ to time $t_1$ flies in the mass spectrometry unit 30. Thereafter, according to the mass and the number of charges, the ionized particles are measured after sequentially reaching the MCP 38 after time $t_2$. The chart in the upper stage illustrates the MCP gain voltage $V_{MCP}$ applied to the MCP 38. That is, the chart illustrates the MCP gain voltage $V_{MCP}$ applied to the MCP 38 by the MCP gain adjustment unit 81 until a subsequent pulse is emitted after an initial or first pulse of the ion beam 201 is emitted.

The horizontal axis of the chart in the middle stage is a flight time (time of flight, TOF) of the ionized particle. This shows a value proportional to a mass to charge ratio m/z between a mass m and the number of charges z. That is, when measurement conditions of the mass spectrometry unit 30 are the same, the TOF has a constant value if the elements have the same mass and the same number of charges. For example, the TOF of $^{11}$B is $t_2$, and the TOF of $^{28}$Si is $t_3$.

In at least one embodiment, this property is used for the measurement as follows. The MCP gain voltage $V_{MCP}$ applied to the MCP 38 is set to $V_3$ when measuring $^{11}$B which is the low concentration element, and the MCP gain voltage $V_{MCP}$ applied to the MCP 38 is set to $V_2$ when measuring $^{28}$Si which is the high concentration element. For example, the MCP gain voltage $V_{MCP}$ is set to $V_3$, and the irradiation of the ion beam 201 starts. The measurement is performed while the MCP gain voltage $V_{MCP}$ is set to $V_3$ even at time $t_2$ when $^{11}$B reaches the MCP 38. Then, after time $t_2$ and before time $t_3$ when $^{28}$Si reaches the MCP, the MCP gain voltage $V_{MCP}$ is switched to $V_2$. In this way, the MCP gain voltage $V_{MCP}$ when the low concentration element ($^{11}$B) reaches the MCP 38 and the measurement is performed is set to the high voltage ($V_3$). In this manner, the measurement sensitivity of the low concentration element can be improved, and the measurement can be accurately performed. In addition, the MCP gain voltage $V_{MCP}$ when the high concentration element ($^{28}$Si) reaches the MCP 38 and the measurement is performed is set to the low voltage ($V_2$). In this manner, the saturation caused by the high concentration element can be prevented, and the degradation of the MCP 38 can be prevented.

As described above, according to at least one embodiment, there is provided the MCP gain adjustment unit 81 that adjusts the MCP gain voltage $V_{MCP}$. The measurement is performed as follows. The MCP gain voltage $V_{MCP}$ is set to the high voltage when measuring the low concentration element, and the MCP gain voltage $V_{MCP}$ is set to the low voltage when measuring the high concentration element. In this manner, the degradation of the MCP 38 can be prevented, and the measurement sensitivity of the low concentration element can be improved. Accordingly, both the low concentration element and the high concentration element can be accurately measured.

In the above description, a case has been described where the number of low concentration elements is one element ($^{11}$B). However, when measuring two or more low concentration elements having different TOFs, the MCP gain voltage $V_{MCP}$ of the high voltage may be applied to the MCP 38 in each TOF.

FIG. 9 is a view illustrating another example of the relationship between the mass spectrum and the MCP gain voltage according to at least one embodiment. For example, in addition to $^{11}$B and $^{28}$Si, $^{75}$As may be an analysis target element, and $^{75}$As is a low concentration element contained in small amounts in the sample 100. In this case, the mass spectrometry is performed as follows. The MCP gain voltage $V_{MCP}$ applied to the MCP 38 is set to $V_3$ when measuring $^{11}$B and $^{75}$As which are the low concentration elements, and the MCP gain voltage $V_{MCP}$ applied to the MCP 38 is set to $V_2$ when measuring $^{28}$Si which is the high concentration element. For example, the MCP gain voltage $V_{MCP}$ is set to $V_3$, and the irradiation of the ion beam 201 starts. The analysis is performed while the MCP gain voltage $V_{MCP}$ is set to $V_3$ even at time $t_2$ when $^{11}$B reaches the MCP 38. Then, after time $t_2$ and before time $t_3$ when $^{28}$Si reaches the MCP, the MCP gain voltage $V_{MCP}$ is switched to $V_2$. Furthermore, after time $t_3$ and before time $t_4$ when $^{75}$As reaches the MCP, the MCP gain voltage $V_{MCP}$ is switched to $V_3$.

In this way, the MCP gain voltage $V_{MCP}$ when the low concentration elements ($^{11}$B and $^{75}$As) reach the MCP 38 and the measurement is performed is set to the high voltage ($V_3$). Accordingly, the measurement sensitivity of the low concentration element can be improved, and the measurement can accurately be measured. In addition, the MCP gain voltage $V_{MCP}$ when the high concentration element ($^{28}$Si) reaches the MCP 38 and the measurement is performed is set to the low voltage ($V_2$). In this manner, the saturation caused by the high concentration element can be prevented, and the degradation of the MCP 38 can be prevented.

Figure 10:
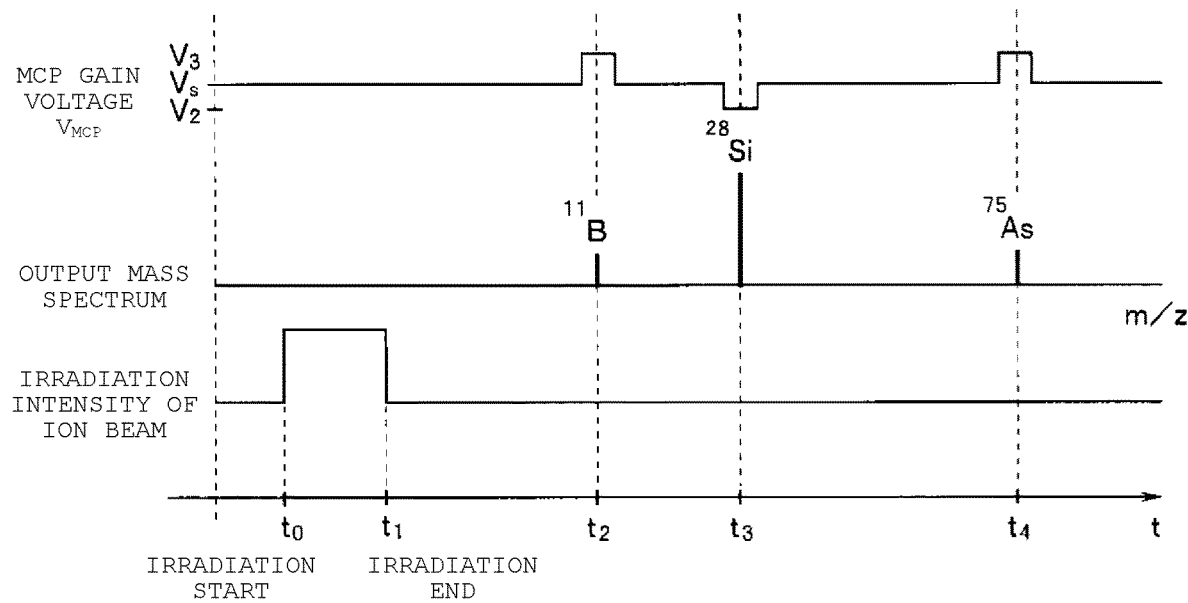
FIG. 10 is a view illustrating a modification example of the relationship between the mass spectrum and the MCP gain voltage according to the first embodiment.

FIG. 10 is a view illustrating a modification example of the relationship between the mass spectrum and the MCP gain voltage according to at least one embodiment. In the above description, when starting the irradiation of the ion beam 201, the MCP gain voltage $V_{MCP}$ for measuring the shortest TOF out of the analysis target elements is applied to the MCP 38. In contrast, the modification example illustrated in FIG. 10 is different in the following point. A reference voltage $V_s$ ($V_2 < V_s < V_3$) of the MCP gain voltage $V_{MCP}$ is provided, and the MCP gain voltage $V_{MCP}$ is adjusted to a predetermined voltage ($V_2$ or $V_3$) only when measuring the low concentration element or the high concentration element.

Specifically, the MCP gain voltage $V_{MCP}$ is set to $V_s$, and the irradiation of the ion beam 201 starts. The MCP gain voltage $V_{MCP}$ is switched to $V_3$ immediately before time $t_2$ when $^{11}$B reaches the MCP 38. Then, immediately after time $t_2$, the MCP gain voltage $V_{MCP}$ is switched to $V_s$. Then, immediately before time $t_3$ when $^{28}$Si reaches the MCP, the MCP gain voltage $V_{MCP}$ is switched to $V_2$. Furthermore, immediately after time $t_3$, the MCP gain voltage $V_{MCP}$ is switched to $V_s$. Thereafter, immediately before time $t_4$ when $^{75}$As reaches MCP, the MCP gain voltage $V_{MCP}$ is switched to $V_3$. Finally, immediately after time $t_4$, the MCP gain voltage $V_{MCP}$ is switched to $V_s$.

In this way, the MCP gain voltage $V_{MCP}$ is switched to a predetermined optimum voltage only when measuring the low concentration element and the high concentration element, and the measurement is performed using a reference voltage (intermediate voltage) at other times. In this manner, a change amount of the voltage is reduced, and a voltage switching time can be shortened.

Second Embodiment

Next, a measurement method of using a time-of-flight mass spectrometer according to a second embodiment of the present disclosure will be described. The time-of-flight mass spectrometer according to the present embodiment is the same as the time-of-flight mass spectrometer 1 according to the first embodiment described above, and thus, the description of the configuration will be omitted. Hereinafter, only the measurement method different from that of the above-described first embodiment will be described.

Figure 11:
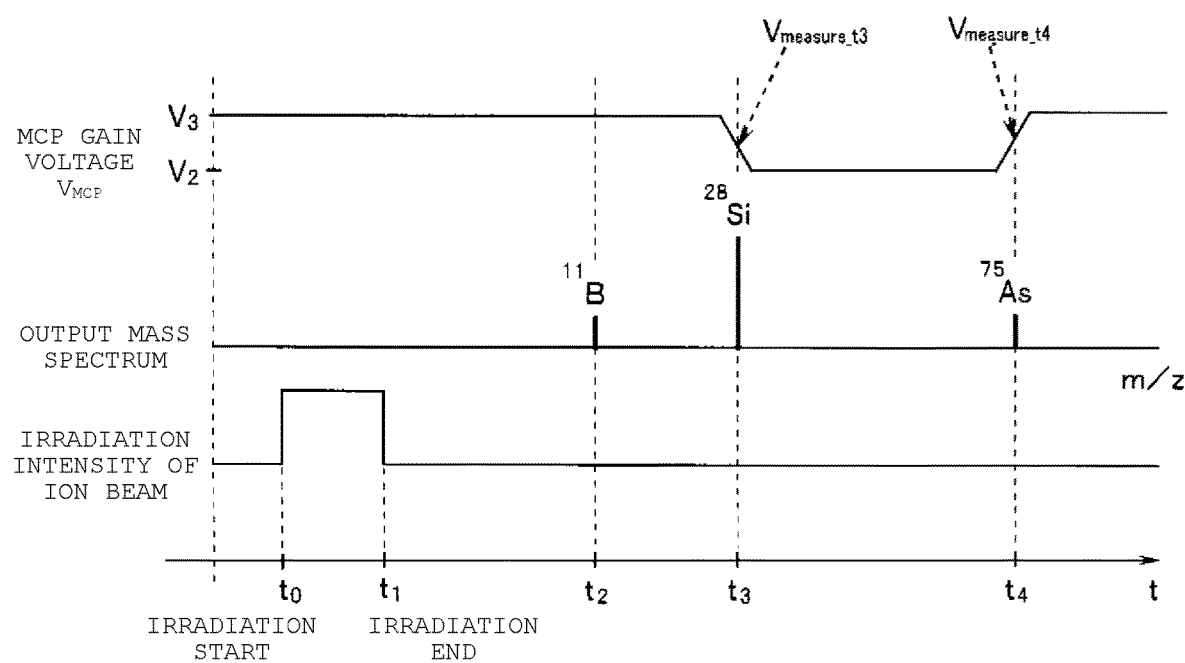
FIG. 11 is a view illustrating an example of a relationship between a mass spectrum and an MCP gain voltage according to a second embodiment.

FIG. 11 is a view illustrating an example of a relationship between a mass spectrum and an MCP gain voltage according to the second embodiment. Usually, a pulse width of the ion beam 201 is approximately several tens of ns to several hundreds of ns, for example. One measurement time (time for acquiring the mass spectrum) is short, for example, approximately several hundreds of ns to several thousand of ns. For example, depending on a flight time of the ionized particle in the mass spectrometry unit 30 or a driving force of the MCP gain adjustment unit 81, in some cases, the MCP gain voltage $V_{MCP}$ is less likely to be instantly lowered or raised within one measurement time. That is, as illustrated in FIG. 11, in some cases, it may be the measurement timing ($t_3$) for the high concentration element while the voltage is lowered, or it may be the measurement timing ($t_4$) for the low concentration element while the voltage is raised.

Therefore, in the present embodiment, the MCP gain voltage $V_{MCP}$ is monitored, and the measurement amount is corrected using the MCP gain voltage $V_{MCP}$ at the measurement timings ($t_2$, $t_3$, and $t_4$) for the low concentration element and the high concentration element.

More specifically, when it is assumed that the low concentration element ($^{11}$B), the high concentration element ($^{28}$Si), and the low concentration element ($^{75}$As) are the analysis target elements, at the measurement timing $t_2$, the MCP gain voltage $V_{MCP}$ is first set to the high voltage ($V_3$), and the low concentration element ($^{11}$B) is measured. Subsequently, at the measurement timing $t_3$, the high concentration element ($^{28}$Si) is measured. At this time, ideally, it is desirable that the MCP gain voltage $V_{MCP}$ is sufficiently lowered from the high voltage ($V_3$) to the low voltage ($V_2$). However, as described above, when a lowering speed of the MCP gain voltage $V_{MCP}$ is not sufficient, the MCP gain voltage $V_{MCP}$ at the measurement timing $t_3$ may become a higher voltage $V_{measure\_t3}$ instead of the low voltage ($V_2$) in some cases. In addition, even when the low concentration element ($^{75}As$) is measured at the measurement timing $t_4$, the MCP gain voltage $V_{MCP}$ may become a lower voltage $V_{measure\_t4}$ instead of the high voltage ($V_3$) in some cases.

Therefore, in the present embodiment, for example, the measurement amounts at the measurement timings $t_3$ and $t_4$ are respectively corrected using the voltages $V_{measure\_t3}$ and $V_{measure\_t4}$ which are monitor values of the MCP gain voltage $V_{MCP}$. For example, a correction amount based on a voltage monitor value can be obtained through an experiment or a simulation.

In this way, the measurement amount is corrected using an actual measurement value of the MCP gain voltage $V_{MCP}$. Accordingly, even when the MCP gain voltage $V_{MCP}$ deviates from target values ($V_2$ and $V_3$), the amount can be more accurately measured. When correcting the measurement amount, the actual measurement value of the MCP gain voltage $V_{MCP}$ obtained by a monitor may be used, or a correction value estimated in advance may be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A time-of-flight mass spectrometer comprising:
    an ion light source configured to generate an ionized particle by emitting an ion beam in a pulse form to a sample;
    a mass spectrometry chamber that causes the ionized particle to fly;
    a micro channel plate (MCP) ion measurer disposed in the mass spectrometry chamber to measure a mass by amplifying the flown ionized particle;
    an MCP reference voltage source configured to apply a voltage to the MCP ion measurer; and
    an MCP gain adjuster configured to adjust a gain of the voltage,
    wherein the MCP gain adjuster is configured to adjust the gain of the voltage until a subsequent pulse is emitted after the ion light source emits a first pulse of the ion beam.

2. The time-of-flight mass spectrometer according to claim 1,
    wherein the MCP gain adjuster is configured to adjust the gain of the voltage in accordance with a flight time of the ionized particle.

3. The time-of-flight mass spectrometer according to claim 2,
    wherein the MCP gain adjuster is configured to:
    adjust the voltage to a first voltage value when the ionized particle corresponding to a first concentration element, the first concentration element being an element having a lower concentration than a second concentration element in the sample, reaches the MCP ion measurer, and
    adjust the voltage to a second voltage value lower than the first voltage value when the ionized particle corresponding to the second concentration element, the second concentration element being an element having a higher concentration in the sample than the first concentration element, reaches the MCP ion measurer.

4. The time-of-flight mass spectrometer according to claim 3,
    wherein the MCP gain adjuster is configured to set the first voltage value, based on a relationship between the applied voltage and measurement intensity of the ionized particle corresponding to the first concentration element.

5. The time-of-flight mass spectrometer according to claim 4,
    wherein the MCP gain adjuster is configured to set the first voltage value within a range where the MCP ion measurer is not in a state of being saturated with a secondary electron in which the ionized particle corresponding to the first concentration element is amplified.

6. The time-of-flight mass spectrometer according to claim 3,
    wherein the MCP gain adjuster is configured to set the second voltage value, based on a relationship between the applied voltage and measurement intensity of the ionized particle corresponding to the second concentration element.

7. The time-of-flight mass spectrometer according to claim 6,
    wherein the MCP gain adjuster is configured to set the second voltage value within a range where the MCP ion measurer is not in a state of being saturated with a secondary electron in which the ionized particle corresponding to the second concentration element is amplified.

8. The time-of-flight mass spectrometer according to claim 3,
    wherein the sample is a semiconductor substrate into which an impurity element is implanted.

9. The time-of-flight mass spectrometer according to claim 8,
    wherein the first concentration element is the impurity element, and the second concentration element is an element forming the semiconductor substrate.

10. A time-of-flight mass spectrometry method comprising:
    generating an ionized particle by emitting an ion beam in a pulse form to a sample;
    causing the ionized particle to fly into a mass spectrometry chamber; and
    measuring a mass of the ionized particle by retrieving the flown ionized particle into an MCP ion measurer to amplify the ionized particle,
    wherein a gain of a voltage applied to the MCP ion measurer is adjusted in accordance with a flight time of the ionized particle until a subsequent pulse is emitted after a first pulse of the ion beam is emitted.

11. The time-of-flight mass spectrometer method according to claim 10,
    wherein the gain of the voltage is adjusted in accordance with a flight time of the ionized particle.

12. The time-of-flight mass spectrometer method according to claim 11, wherein the adjusting the voltage further comprises:

adjusting the voltage to a first voltage value when the ionized particle corresponding to a first concentration element, the first concentration element being an element having a lower concentration in the sample than a second concentration element, reaches the MCP ion measurer, and adjusting the voltage to a second voltage value lower than the first voltage value when the ionized particle corresponding to the second concentration element, the second concentration element being an element having a higher concentration in the sample than the first concentration element, reaches the MCP ion measurer.

13. The time-of-flight mass spectrometer method according to claim 12, further comprising:

setting the first voltage value, based on a relationship between the applied voltage and measurement intensity of the ionized particle corresponding to the first concentration element.

14. The time-of-flight mass spectrometer method according to claim 13, further comprising:

setting the first voltage value within a range where the MCP ion measurer is not in a state of being saturated with a secondary electron in which the ionized particle corresponding to the first concentration element is amplified.

15. The time-of-flight mass spectrometer method according to claim 12, further comprising:

setting the second voltage value, based on a relationship between the applied voltage and measurement intensity of the ionized particle corresponding to the first concentration element.

16. The time-of-flight mass spectrometer method according to claim 15, further comprising:

setting the second voltage value within a range where the MCP ion measurer is not in a state of being saturated with a secondary electron in which the ionized particle corresponding to the second concentration element is amplified.

17. The time-of-flight mass spectrometer method according to claim 12, wherein the sample is a semiconductor substrate into which an impurity element is implanted.

18. The time-of-flight mass spectrometer method according to claim 17, wherein the first concentration element is the impurity element, and the second concentration element is an element forming the semiconductor substrate.

* * * * *